United States Patent [19]

Schweitzer, Jr.

[11] Patent Number: 5,220,311

[45] Date of Patent: Jun. 15, 1993

[54] DIRECTION INDICATING FAULT INDICATORS

[76] Inventor: Edmund O. Schweitzer, Jr., 2433 Center St., Northbrook, Ill. 60062

[21] Appl. No.: 657,503

[22] Filed: Feb. 19, 1991

[51] Int. Cl.⁵ .............................. G08B 21/00
[52] U.S. Cl. ................... 340/650; 340/664; 324/133; 324/522
[58] Field of Search ............ 340/650, 657, 660, 662, 340/664; 324/133, 127, 522; 361/93, 94

[56] References Cited

U.S. PATENT DOCUMENTS

| | | | |
|---|---|---|---|
| 3,535,593 | 10/1970 | Schweitzer, Jr. | 340/664 X |
| 4,495,489 | 1/1985 | Schweitzer, Jr. | 340/664 |
| 4,794,324 | 12/1988 | Schweitzer, Jr. | 340/664 X |

*Primary Examiner*—Jin F. Ng
*Assistant Examiner*—Jeffery A. Hofsass
*Attorney, Agent, or Firm*—Lockwood, Alex, FitzGibbon & Cummings

[57] ABSTRACT

A fault indicator for indicating the occurrence and relative direction of a fault current in a power transmission or distribution system includes a rotatably mounted indicator flag. The indicator flag is actuated 90° clockwise or counterclockwise from a central reset position to up-line indicating or down-line indicating trip positions by a compact magnetic pole piece assembly having three radially extending magnetic pole segments which interact with four magnetic poles on a magnetic armature rotatably coupled to the indicator flag. A pair of magnetic windings magnetize the pole segments upon the occurrence of a fault current to rotate the flag from the reset position. A second pole piece and winding directionally actuated in response to the direction of the fault current determines the direction of rotation of the indicator flag to indicate whether the fault is upline or downline relative to the indicator.

18 Claims, 5 Drawing Sheets

DIRECTION INDICATING FAULT INDICATORS

BACKGROUND OF THE INVENTION

The present invention relates generally to current sensing devices for electrical systems, and more particularly to fault direction indicating alternating current fault indicators.

Various types of fault indicators have been constructed for indicating the occurrence of electrical faults in power distribution systems, including clamp-on type fault indicators, which clamp directly over cables in such systems, and test point type fault indicators, which are mounted on test points in cables or associated connectors of the systems. Examples of such fault indicators are found in products manufactured by E. O. Schweitzer Manufacturing Company of Mundelein, Ill., and in U.S. Pat. Nos. 3,676,740; 3,816,816; 3,906,477; 4,034,360; 4,063,171; 4,086,529, 4,234,847; 4,438,403; 4,458,198; 4,495,489 and 4,794,329 of the present inventor.

In certain applications, such as where two interconnected current sources are present in a single system, it is desirable that a fault indicator, in addition to indicating the occurrence of a fault, indicate the direction of the fault, i.e., whether the fault is upline or downline relative to the location of the indicator on the monitored conductor. On a tie line between two power stations, for example, such direction indications from multiple fault indicators located at spaced locations along the tie line allow the location of a fault along the tie line to be quickly determined and repaired.

The present invention provides a fault indicator which indicates both the occurrence and the relative direction of a fault.

Typically, in a fault indicator detection of fault currents is accomplished by means of a magnetic reed switch or sensing coil positioned in close proximity to the conductor being monitored. Upon occurrence of an abnormally high fault-associated magnetic field around the conductor, the reed switch or sensing coil activates a trip circuit which produces current flow in a trip winding on a magnetic pole assembly which positions a magnetically actuated indicator flag visible from the exterior of the indicator to a fault-indicating position. Upon restoration of current in the conductor, a reset circuit is activated to produce current flow in a reset winding on the pole assembly to reposition the indicator flag to a reset or non-fault indicating position. The invention described in the aforementioned U.S. Pat. No. 4,438,403 provides an improvement in such electromechanical fault indicators, in that it provides a simplified circuit for use in conjunction with a single bidirectional magnetic winding on the pole assembly in place of separate trip and reset windings.

To minimize the power required by the trip and reset circuit in repositioning the electromechanical indicator between reset and trip positions it is desirable that the indicator flag have minimal mass and minimal travel between positions. To these ends a four pole magnetic pole assembly has been used, together with an indicator flag arranged to rotate 90° upon occurrence of a fault, as described in the aforementioned U.S. Pat. No. 4,495,489.

In the aforementioned U.S. Pat. No. 4,063,171 a fault indicator is described which is responsive to fault currents in one direction only, no indication being given for a fault in the other direction or in the absence of a fault current. In U.S. Pat. No. 3,535,593 of the present inventor a power line monitoring device is described wherein the direction of current flow under normal non-fault conditions is indicated by lamps or an electromechanical meter.

In contrast to these devices, the present invention provides a direction-indicating fault indicator having an electromechanical indicator wherein the indicator flag rotates 90° clockwise or counterclockwise from a neutral reset position under the influence of a stationary three pole magnetic pole assembly and a four pole magnetic armature rotatably coupled to the indicator flag, the direction of rotation of the armature being determined by a second pole assembly directionally magnetized by an additional winding to rotate the armature according to the relative direction of the fault.

Accordingly, it is a general object of the present invention to provide a new and improved direction-indicating fault indicator.

It is a more specific object of the present to provide a fault indicator having a compact electromechanical indicator flag assembly for indicating the occurrence and direction of a fault current.

SUMMARY OF THE INVENTION

The invention is directed to a fault indicator for indicating the direction and occurrence of a fault current in an electrical conductor of an alternating current power distribution system comprising a housing, status indicating means viewable from the exterior or the housing having a reset-indicating state and first and second fault-indicating states, and circuit means responsive to the occurrence and direction of a fault current in the monitored conductor for conditioning the status indicating means to the first fault-indicating state upon the occurrence of a fault upline of the fault indicator and to the second fault indicating state upon the occurrence of a fault downline of the fault indicator.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
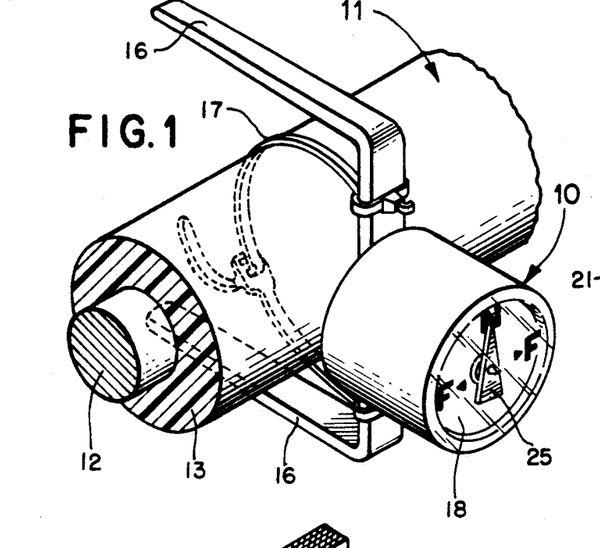
FIG. 1 is a perspective view of an electrostatically powered direction-indicating fault indicator constructed in accordance with the invention mounted on a cable in an electrical distribution system.

Referring to the FIGS., and particularly to FIG. 1, a fault indicator 10 incorporating the invention is shown installed on an electrical cable 11, comprising part of an electrical distribution system. In accordance with conventional practice, cable 11 includes a central conductor 12 surrounded by an insulating layer 13.

Figure 2:
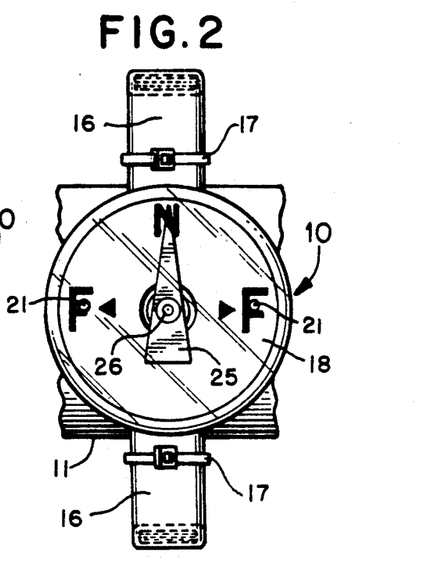
FIG. 2 is a front elevational view of the fault indicator of FIG. 1.
Figure 3:
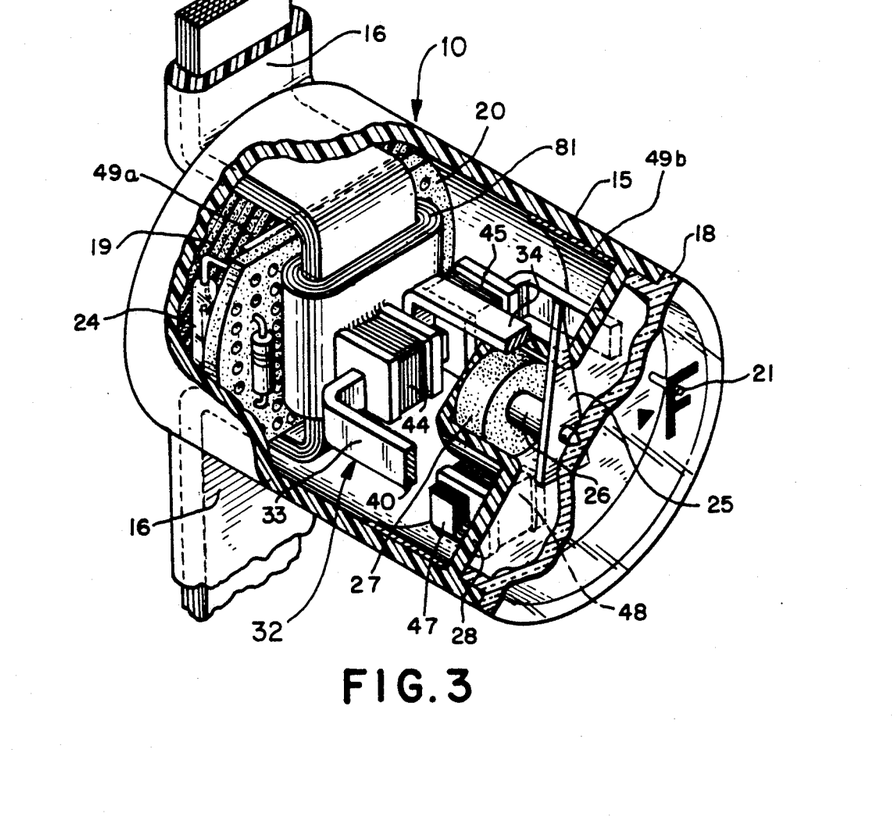
FIG. 3 is an enlarged perspective view of the fault indicator of FIG. 1 with the housing thereof partially broken away to illustrate the internal construction of the indicator.

Referring to FIGS. 1-3, fault indicator 10 is seen to comprise a generally cylindrical electrically non-conductive plastic housing 15 attached at its rear end to cable 11 by means of a magnetic core assembly 16 and a non-metallic mounting strap 17. A transparent plastic end cap 18 is bonded by appropriate means to the front end of the housing A layer 19 of epoxy or other suitable material may be provided at the other end to seal the housing.

Within housing 15 the principal electrical components of the fault indicator are mounted on a disc-shaped circuit board 20 mounted within the housing perpendicular to the axis of the housing at locations spaced from end cap 18. To provide for the sensing of fault currents in conductor 12, a magnetic reed switch 24 is mounted on the rear surface of circuit board 20. Upon occurrence of a fault current this reed switch closes to energize circuitry which conditions the indicator to a fault indicating state.

The occurrence of a fault current in conductor 12 is indicated to an observer by means of an indicator flag 25 mounted on a rotatable shaft 26 within housing 14. Actuation of flag member 25 between reset and first and second fault indicating positions against respective stop pins 21 is accomplished by an annular flag actuator magnet 27 which is rotatably coupled to flag member 25 by shaft 26. Shaft 26 is maintained in alignment with the axis of indicator housing 14 by means of a bearing surface in a divider wall 28, which is preferably opaque and of a suitable color to provide a viewing background for indicator flag 25.

Referring to FIGS. 4A-4F actuator magnet 27, which may be constructed of a magnetic material having a high coercive force, such as ceramic, is formed to provide four magnetic poles of opposite polarity, with opposite magnetic polarities at 90° intervals about the circumference of the magnet. Actuator magnet 27, and hence indicator flag 25, are biased to the position shown in FIGS. 1-3 when the fault indicator is in a non-tripped or reset condition by means of an electromechanical flag actuator assembly 30, which includes three magnetic pole segments in magnetic communication with three 90° circumferentially-spaced locations on actuator magnet 27. The flag actuator assembly 30 is mounted on circuit board 20 such that the three magnetic poles of the actuator assembly extend to positions adjacent the magnetic poles of actuator magnet 27.

Figure 4A:
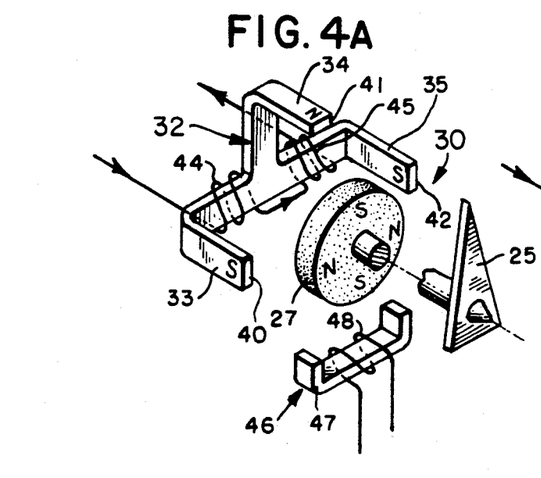
FIG. 4A is a diagrammatic view showing certain principal components of the fault indicator in a normal or reset state.

The flag actuator assembly 30 comprises, in accordance with one aspect of the invention, a generally T-shaped magnetic pole piece 32 formed of a magnetic material having a relatively low coercive force, such as chrome steel. As best shown in FIG. 4A, pole piece 32 comprises three magnetic pole segments 33-35 each having an initial portion which extends in a plane generally perpendicular to the axis of indicator housing 15 and flag member 25, and an end portion which extends forward generally parallel to the axis and terminates with respective magnetic poles 40-42 in close proximity to the circumference of flag actuator magnet 27. The pole piece 32 is preferably formed as a one piece element by conventional forming techniques.

Magnetization of pole piece 32 is accomplished by a pair of magnetic windings 44 and 45 located on pole segments 33 and 35, respectively. To conserve winding space, it is preferable that windings 44 and 45 be untapped opposing windings to which current is supplied in one direction to establish a fault-indicating status in pole piece 32, and in the opposite direction to establish a reset-indicating condition, as described in previously identified U.S. Pat. No. 4,438,403.

During normal circuit operation the poles of pole piece 32 are biased to the magnetic polarities indicated in FIG. 4A. As a result, the opposite polarity poles of flag actuator magnet 27 are attracted to position the indicator flag 25 as shown, vertically aligned as viewed from the exterior of housing 15 in FIG. 2.

On the occurrence of a fault current in conductor 12, which may, for example, exceed 400 amperes, pole piece 32 is remagnetized to the magnetic polarities shown in FIGS. 4B-4E by momentary energization of the series-connected magnetic windings 44 and 45. As a result, the poles of flag actuator magnet 27 are repelled by adjacent like-polarity poles of the pole piece and the indicator flag is caused to rotate either clockwise or counterclockwise 90° to one of the tripped positions shown in FIGS. 4C or 4E.

Figure 4B:
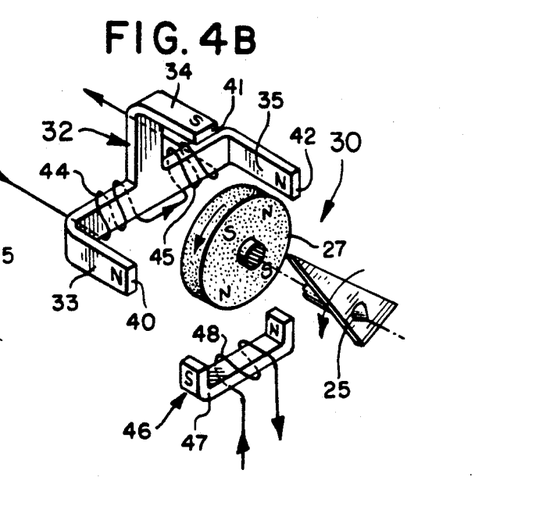
FIG. 4B is a diagrammatic view similar to FIG. 4A showing the fault indicator in transition between a reset state and a tripped state in response to a fault in one direction.
Figure 4C:
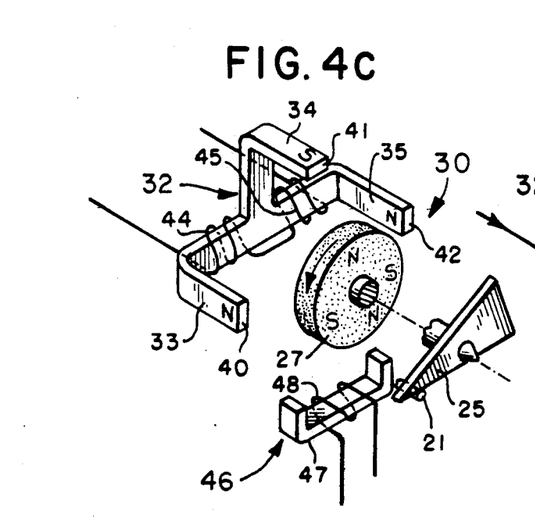
FIG. 4C is a diagrammatic view similar to FIG. 4A showing the fault indicator in a tripped state in response to the fault in the one direction.
Figure 4D:
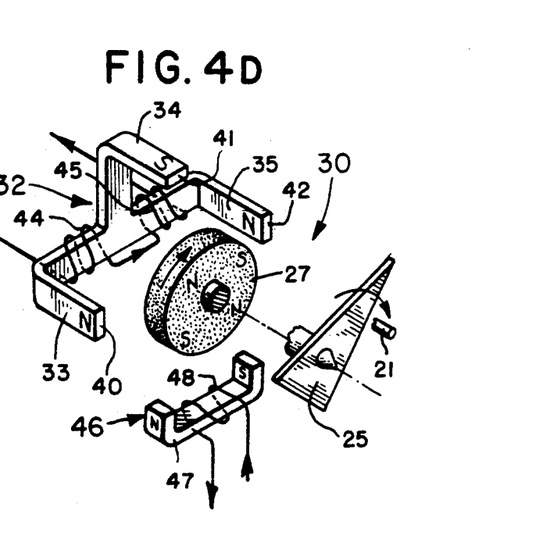
FIG. 4D is a diagrammatic view similar to FIG. 4A showing the fault indicator in transition between a reset state and a tripped state in response to a fault in the other direction.
Figure 4E:
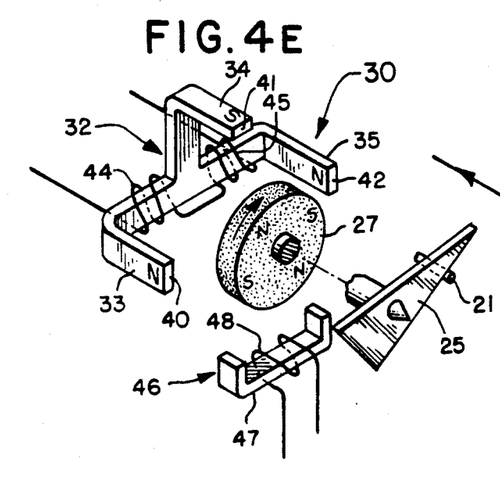
FIG. 4E is a diagrammatic view similar to FIG. 4A showing the fault indicator in a tripped state in response to the fault in the other direction.
Figure 4F:
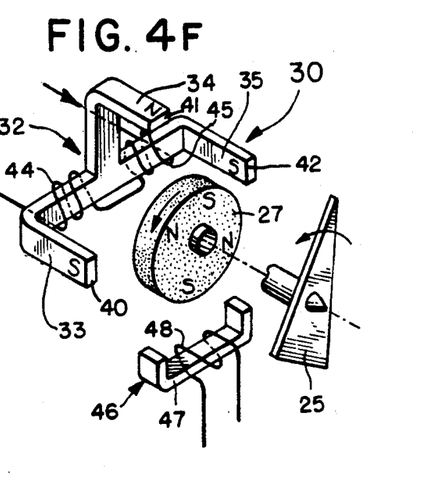
FIG. 4F is a diagrammatic view similar to FIG. 4A showing the fault indicator in transition between the tripped state of FIG. 4E and the reset state of FIG. 4A.

The indicator flag remains in either fault indicating position until the poles of pole piece 32 are subsequently remagnetized to the magnetic polarities shown in FIGS. 4A and 4E by momentary energization of magnetic windings 44 and 45 in the reverse direction. Then flag actuator magnet 27 and indicator flag 25 are caused to rotate from either trip position to the reset position shown in FIG. 4A and the fault indicator is in condition to respond to a subsequent fault current.

In accordance with the invention, the direction of rotation of armature 27 and indicator flag 25 is controlled by an additional magnetic pole assembly 46 comprising a generally U-shaped magnetic pole piece 47 and a magnetic winding 48. As shown in FIG. 4B, upon occurrence of an upline fault current winding 48 is energized with current flow in a direction which causes armature 27 and indicator flag 25 to rotate from their reset position in the relative direction of the fault. Conversely, as shown in FIG. 4D, upon occurrence of a downline fault a reverse current is applied to winding 48 and armature 27 and flag 25 are caused to rotate clockwise in the direction of the fault.

Figure 5:
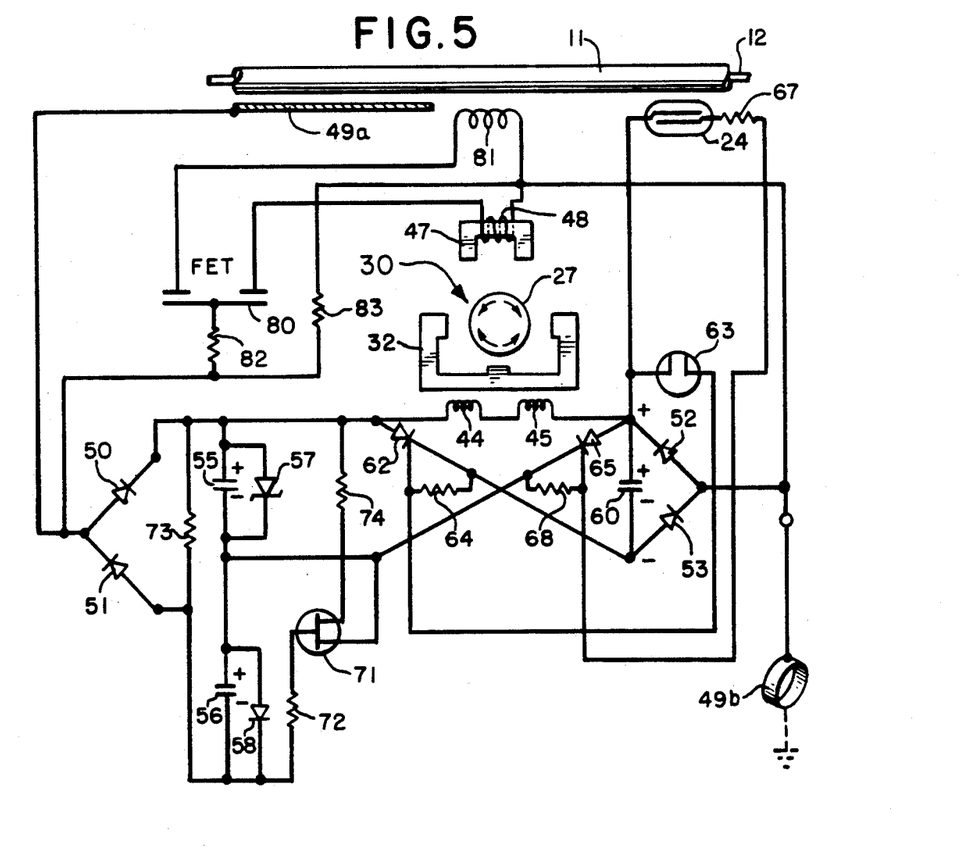
FIG. 5 is an electrical schematic diagram of the fault indicator of FIGS. 1-3.
Figures 6, 7, 8:
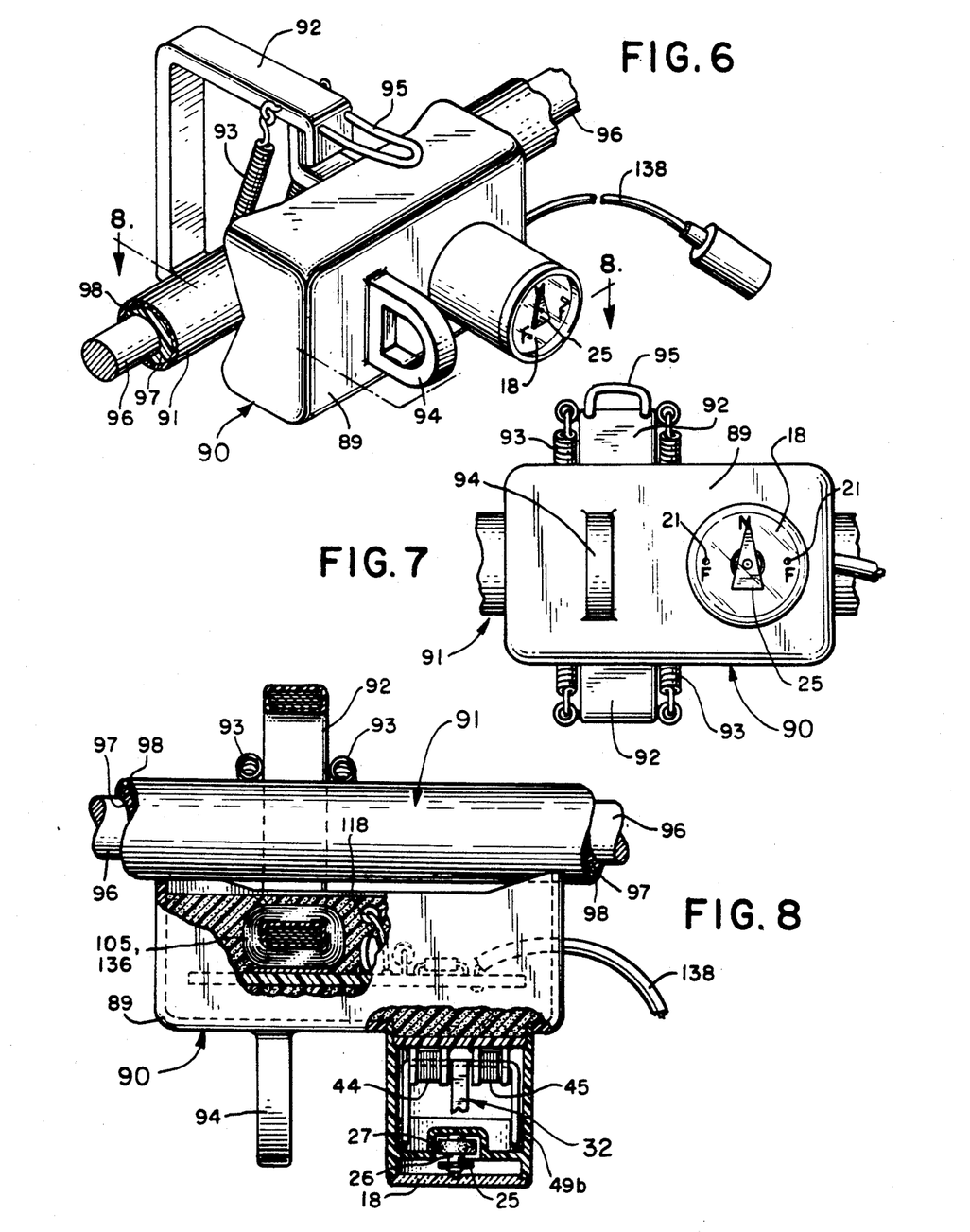
FIG. 6 is a perspective view of an alternate current-powered construction for the direction-indicating fault indicator of the invention.
FIG. 7 is a front elevational view of the current-powered fault indicator of FIG. 6.
FIG. 8 is a side elevational view, partially broken away, showing certain principal components of the current-powered fault indicator of FIGS. 6-7.

Energization of magnetic windings 44 and 45 by current in one direction upon occurrence of a fault current in conductor 12, and energization of the windings by current in the opposite direction upon restoration of normal current flow in conductor 12, is accomplished by means of circuitry contained within indicator housing 15. Referring to FIG. 5, this circuitry is seen to comprise a first rectifier network comprising a pair of rectifier diodes 50 and 51 connected either through a cable (not shown) to a source of alternating current, or to an electrostatic pick-up plate 49a as shown. A second rectifier network comprising a pair of rectifier diodes 52 and 53 is connected to a ring-shaped element 49b, which provides an electrical ground within the electrostatic gradient of the cable in a manner well known to the art. Together, the two rectifier networks provide high input impedance rectification of an alternating current derived from the field to provide direct current for energization of the circuitry of fault indicator 10.

The pulsating direct current developed by diodes 50 and 51 during normal current flow in conductor 12 is applied to a trip capacitor 55 and a trip inhibit capacitor 56 connected in series across the output terminals of the network. A zener diode 57 connected across trip capacitor 55 limits the voltage developed across that capacitor to the threshold voltage of the zener diode, and a forward-biased diode 58 connected across trip inhibit capacitor 56 limits the voltage developed across that device during the charge cycle of the capacitor to the forward drop of the diode.

The pulsating direct current developed by diodes 52 and 53 is applied to a reset capacitor 60 connected across the output of the second rectifier network, causing that capacitor to also be charged during normal current flow.

To provide for periodic reset of the fault indicator, capacitor 60 is periodically discharged through the series-connected windings 44 and 45 of flag indicator assembly 30. To this end, a silicon controlled rectifier (SCR) 62 is periodically conditioned into conduction by the discharge of a neon lamp 63 in the gate circuit of the SCR upon the voltage across capacitor 60 exceeding a predetermined threshold level. A resistor 64 provides bias to the SCR gate electrode.

Following the discharge of reset capacitor 60 through windings 44 and 45, the voltage across the capacitor drops, neon lamp 63 extinguishes, and SCR 62 ceases to conduct. Capacitor 60 then begins to recharge until the voltage the across reset capacitor 60 again reaches the threshold level of neon lamp 63 and conduction through SCR 62 accomplishes another reset cycle. The repetition rate of the reset cycle is dependent on the capacitance of reset capacitor 60 and the effective impedance of the charging circuit. In practice, the reset cycle may occur approximately every 2 minutes.

Upon occurrence of a fault current in conductor 12, trip capacitor 55 is caused to discharge in a reverse direction through windings 44 and 45 through a second silicon controlled rectifier (SCR) 65. This results from closure of the contacts of reed switch 24, which is positioned in magnetic communication with cable 11 and connected to the gate electrode of SCR 65 through a gate circuit comprising a series resistor 67 and a resistor 68 to ground.

Trip capacitor 55 continues to discharge until the discharge current is no longer sufficient to maintain conduction through SCR 65, after which current flow ceases. However, magnetic pole piece assembly 32 remains in a magnetic polarity which maintains magnet 27 and indicator flag 25 in a fault indicating position. Upon restoration of normal current in conductor 12, it remains for the reset circuit of reset capacitor 60 to remagnetize assembly 32 to reposition indicator flag 25 to a reset-indicating position.

To prevent false fault indications as a result of the inrush current associated with initial power-up of the monitored conductor 12, the fault indicator may include trip inhibit capacitor 56 and its associated inhibit circuitry for discharging trip capacitor 55 upon such initial power-up. In particular, the control electrodes of an enhanced FET-type transistor 71 are connected across trip inhibit capacitor 56 through a resistor 72. During normal operation the forward-bias of diode 58 across capacitor 56 biases transistor 71 into cut-off. Upon loss of excitation trip capacitor 55 is caused to partially discharge through a resistor 73 into trip inhibit capacitor 56, causing the voltage across that device to reverse polarity and progressively increase in the reverse direction as the device is charged. Eventually the threshold voltage of transistor 71 is reached and the transistor is rendered conductive by the applied forward bias from capacitor 56, causing trip capacitor 55 to rapidly discharge through a resistor 74 and therefore be unavailable for providing trip current to windings 44 and 45 upon conduction by SCR 65. Thus, after loss of voltage in conductor 12, the fault indicator is non-responsive to a fault current which occurs following the restoration of power in conductor 12, and does not become operative for this purpose until capacitor 55 has again been charged. This may in practice require several minutes.

Winding 48 is supplied with current having a unidirectional component in a direction appropriate to the direction of fault power flow by a symmetrical depletion type field effect transistor (FET) 80 and a magnetic pick-up winding 81 on core assembly 16. FET 80 acts as a rectifier, conduction between its main electrodes being determined by the phase angle between an alternating current voltage signal derived from the conductor impressed on its gate electrode relative to the signal concurrently induced in winding 81 and impressed on the source and drain electrodes of the FET. Depending on the phase angle, the rectifier conducts more heavily in one direction or the other, causing a unidirectional current component to be applied to direction-controlling winding 48. The voltage signal applied to the gate electrode corresponds to the instantaneous alternating potential on conductor 12 and is derived by electrostatic pick-up plate 49a and applied to the gate electrode through a resistor 82, which protects the FET from voltage spikes. The source and drain electrodes are connected through respective ones of windings 48 and 81 to electrostatic grounding ring 49b to prevent the electrodes from developing an isolated charge. Resistor 83 provides a high impedance connection between the electrostatic pick-up plate 49a and the electrostatic ground ring 49b to similarly prevent the source element from developing an isolated charge.

In particular, auxiliary pole assembly 46 exerts a rotational force on the most adjacent poles of the flag actuator magnet 27, causing a rotational moment to be exerted on indicator flag 25, tending to turn the flag in a predetermined (counterclockwise in FIGS. 4B-4C, clockwise in FIGS. 4D-4E) direction such that the flag is precluded from remaining in its reset position, even if it should be perfectly positioned and have a degree of bearing friction. Once rotation has been established in the designated direction, the greater force of the main pole piece 32 overcomes the effect of the auxiliary pole piece 46 and rotation continues until the target is aligned in one of the fault-indicating positions shown in FIGS. 4C and 4E.

The invention may also be incorporated in a current-powered type fault indicator 90 of the type intended for installation on a lower voltage cable, such as shown in FIGS. 6-9. Basically, this type of indicator includes a housing 89 mounted on a cable 91 by means of a magnetic core assembly 92 which fits around the cable and is held in a locked position by a pair of springs 93. An eyelet 94 molded into housing 89 and an eyelet 95 at the end of the magnetic core assembly facilitate installation and removal of the fault indicator from powered conductors by means of conventional lineman's tools. Cable 91 may in accordance with conventional practice include a central conductor 96, a concentric insulating layer 97, and an electrically conductive outer sheath 98.

Figures 9, 10:
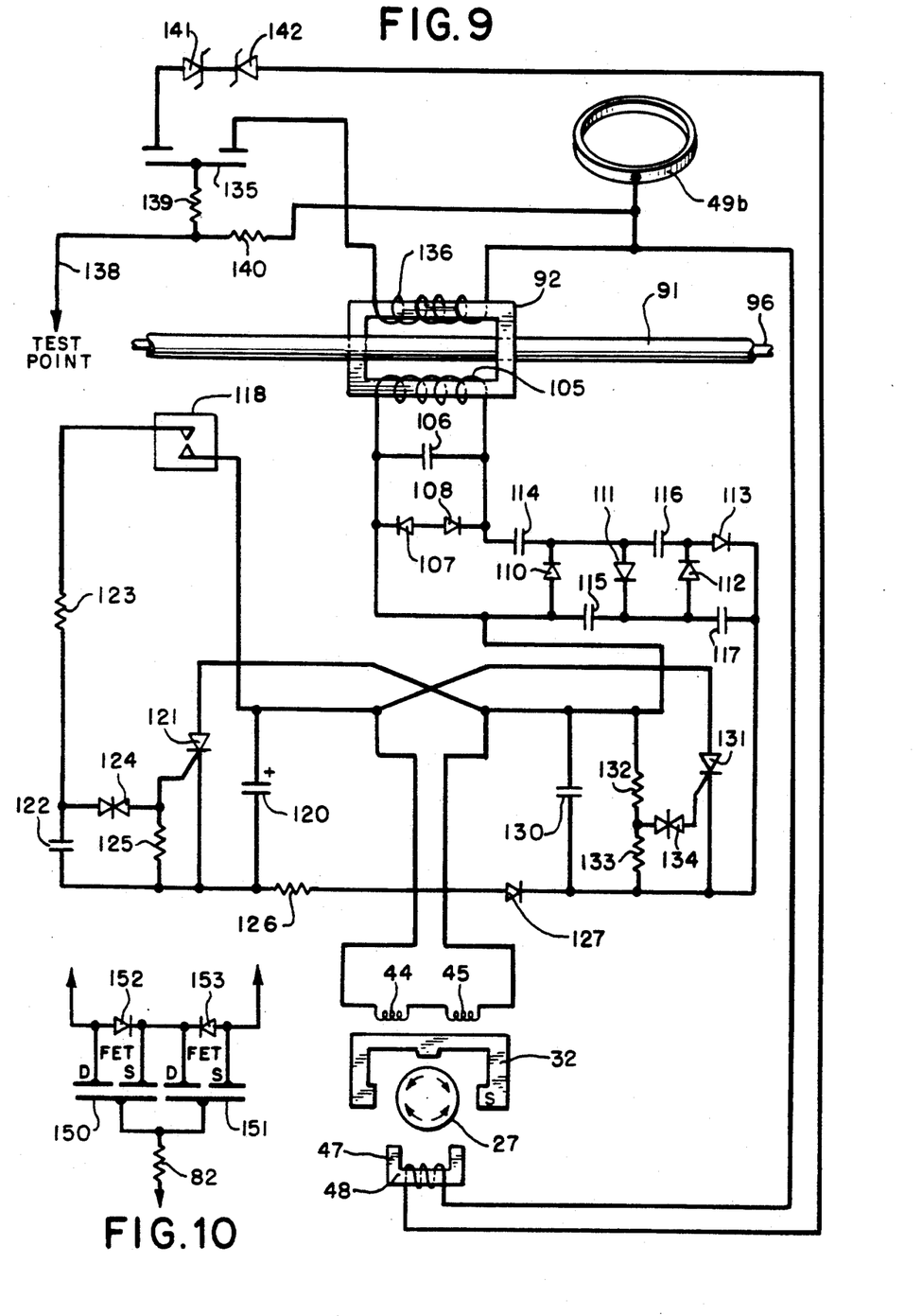
FIG. 9 is a schematic diagram of the current-powered fault indicator of FIGS. 6-8.
FIG. 10 is a schematic diagram showing the substitution of non-symmetrical FET switch devices for the symmetrical FET switch device in FIG. 5.

Referring to FIG. 9, power for operation of the fault indicator is obtained from a pick-up winding 105 on core 92 within housing 89 within which an alternating current is induced as a consequence of the alternating current in conductor 96. The winding is tuned to resonance power at the line frequency by a capacitor 106 and the resultant resonant output signal is peak-limited by a pair of zener diodes 107 and 108 connected back-to-back across the winding. The resonant signal is increased in voltage by a conventional voltage multiplier circuit comprising diodes 110-113 and capacitors 114-117 to develop in a manner well known to the art a direct current of sufficient magnitude for powering the circuitry of the indicator.

The remaining circuitry of the fault indicator is similar in form and function to that previously described in detail in connection with the embodiment of FIGS. 1-5. In particular, the same magnetic pole assemblies 32 and 47, flag actuator magnet 27 and indicator flag 25 may be employed, together with flag actuator windings 44, 45 and 48. This assembly may be arranged to project forward from the housing as shown.

Upon occurrence of a fault, a reed switch 118 in magnetic communication with conductor 96 closes, causing a trip capacitor 120 to discharge through an SCR 121 and windings 44 and 45 to cause rotation of indicator flag 25 from its center reset position. To this end, a capacitor 122 and a resistor 123 in the SCR gate circuit provide a trip time constant, an avalanche diode 124 provides an SCR gate threshold level, and a resistor 125 provides SCR gate bias. Capacitor 120 is charged by the voltage multiplier circuit through windings 44 and 45, and a resistor 126 and a diode 127.

Periodic reset of the fault indicator is accomplished by a capacitor 130, which is periodically discharged through an SCR 131 conditioned to conduct when the portion of the voltage developed across the capacitor and applied to the SCR gate electrode by a pair of resistors 132 and 133 exceeds the threshold voltage of an avalanche diode 134 in the gate circuit.

In a manner similar to that of the embodiment of FIGS. 1-5, a direction-indicating current is supplied to winding 48 by a symmetrical depletion type FET 135, which acts as rectifier to alternating current induced in a winding 136 in magnetic communication with conductor 96. Winding 136 is contained on magnetic core 92 with winding 105. A voltage corresponding to the instantaneous voltage on the conductor is derived by direct connection through a cable 138 to a conventional test point or other voltage pick-up point, or alternatively by an internal electrostatic coupling plate (not shown) and applied to the control electrode of FET 135 through a resistor 139. The source and drain electrodes of FET 135 are connected through windings 48 and 136 to electrostatic grounding ring 49b to prevent the electrodes from floating. The test point source is connected to ground by a resistor 140 for the same purpose. A pair of zener diodes 141 and 142 connected back-to-back preclude loading of winding 105 by winding 136 in the absence of a fault current.

Referring to FIG. 10, a pair of non-symmetrical field effect transistors 150 and 150 may be substituted for the single symmetrical field effect transistor shown in FIG. 5. To this end, a pair of diodes 152 and 153 are connected between the source(s) and drain (D) electrodes of each transistor, and the gate electrodes are connected together to resistor 82. Thus connected, the transistor conductor during alternate half cycles, with the result that a unidirectional current component is generated like that generated by FET 80.

The invention provides a direction indicating fault indicator, of either the electrostatically powered type for installation of an overhead line, or of the current-powered type for installation on a cable, which is efficient in that it does not require an additional power source, such as a battery, and which is compact, and adaptable to a wide range of applications requiring an indication of the direction of an electrical fault.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for alternating the occurrence and direction of a fault current in an electrical conductor of an alternating current power distribution system, comprising, in combination:

a housing;

status indicating means viewable from the exterior of said housing, said status indicating means having a reset-indicating state and first and second fault-indicating states in response to an applied control signal; and circuit means responsive to the occurrence and direction of a fault current in the conductor for conditioning said status indicating means to said first fault-indicating state upon the occurrence of a fault upline of said fault indicator, and to said second fault indicating state upon the occurrence of a fault downline of said fault indicator; and said circuit means including magnetic coupling means in magnetic communication with the conductor for sensing the direction of fault power flow in the conductor, voltage sensing means for sensing alternating voltage on the conductor, and switch means responsive to said sensed direction of fault power flow in the conductor and said sensed alternating voltage for developing a control signal for conditioning said status indicating means.

2. A fault indicator as defined in claims 1 wherein said voltage sensing means comprise a sensing electrode capacitively coupled to the conductor.

3. A fault indicator as defined in claim 2 wherein said status indicating means are magnetically actuated, said circuit means include a magnetic winding for controlling the actuation of said status indicating means, and said switch means control the application of current to said magnetic winding.

4. A fault indicator as defined in claim 2 wherein said switch means comprise a depletion type field effect transistor.

5. A fault indicator for indicating the occurrence and direction of a fault current in an electrical conductor of an alternating current distribution power system, comprising, in combination:
means including a magnetic winding for producing a magnetic field in response to an applied current, said magnetic field being of one polarity in response to current applied to said winding in one direction, and of the opposite polarity in response to current applied to said winding in the opposite direction;
status indicating means in magnetic communication with said magnetic winding, said status indicating means assuming a reset-indicating state in response to the occurrence of a magnetic field of said one polarity in the winding, and assuming either a first or a second fault-indicating state in response to the occurrence of a magnetic field of said opposite polarity in said winding;
trip circuit means responsive to occurrence of a fault in the conductor for developing a unidirectional current in said magnetic winding in said opposite direction whereby said status indicating means is conditioned to one of said fault indicating states;
means including an additional magnetic winding for producing an additional magnetic field upon occurrence of said fault current, said magnetic field having a component in one direction in response to current supplied to said winding in one direction, and in the opposite direction in response to current supplied in the opposite direction, said status indicating means being in magnetic communication with said additional winding and assuming either said first or second fault indicating positions according to the direction of said additional magnetic field component;
direction-indicating circuit means responsive to the direction of fault power flow in the conductor for supplying a unidirectional current component to said additional winding whereby said status indicating means is actuated to the appropriate one of said fault indicating positions upon occurrence of the fault current; and
reset circuit means for periodically developing a unidirectional current in said magnetic winding in said one direction upon restoration of current in the conductor whereby said status indicating means is conditioned to said reset state.

6. A fault indicator as defined in claim 5 wherein said status indicating means comprise a magnetizable core.

7. A fault indicator as defined in claim 5 having a housing, and wherein said status indicating means comprise a mechanical member visible from the exterior of said housing, said mechanical member having a first position corresponding to said reset state, and second and third positions corresponding to said fault-indicating states.

8. A fault indicator as defined in claims 5 wherein said direction-indicating circuit means include magnetic coupling means for sensing the direction of fault power flow in the conductor.

9. A fault indicator as defined in claims 8 wherein said magnetic coupling means comprise an additional magnetic winding in magnetic communication with the conductor.

10. A fault indicator as defined in claim 9 wherein said direction-indicating circuit means further include voltage sensing means for sensing alternating voltage on the conductor, and switch means responsive to said sensed alternating voltage and said sensed direction of fault power flow in the conductor for developing a control signal from said alternating current for conditioning said status indicating means.

11. A fault indicator as defined in claim 10 wherein said voltage sensing means comprise a sensing electrode capacitively coupled to the conductor.

12. A fault indicator as defined in claim 11 wherein said switch means comprise a depletion type field effect transistor.

13. A fault indicator for indicating the occurrence and direction of a fault current in an electrical conductor of an alternating current power distribution system, comprising, in combination:
a housing;
status indicating means comprising an indicator flag rotatably mounted within said housing, said indicator flag having a first position corresponding to a reset state, and second and third positions corresponding to first and second fault-indicating states, said positions being spaced 90° about the axis of rotation of the indicator flag;
a flag actuator magnet rotatably coupled to said indicator flag, said actuator magnet having first, second, third and fourth magnetic poles of alternating magnetic polarity spaced 90° around said axis of rotation;
means comprising a magnetic pole piece having first, second and third magnetic pole segments extending to predetermined locations in magnetic communication with respective ones of said first, second and third poles of said flag actuator magnet;
circuit means including a magnetic winding on said pole piece for conditioning said first magnetic pole segment to a first magnetic polarity, and said second and third magnetic pole segments to an opposite magnetic polarity during normal current flow in the conductor, and for reversing the polarities of said pole segments upon occurrence of a fault current in the conductor, whereby said indicator flag is caused to rotate from said first position to one of said second and third positions upon occurrence of a fault current;
means comprising an additional magnetic pole piece in magnetic communication with said flag actuator magnet along the circumference of rotation of said actuator magnet so as to cause said magnet to rotate in a predetermined direction according to the direction of the magnetic field in said additional pole piece upon said magnetic pole segments changing magnetic polarity; and additional circuit means including a magnetic winding on said additional pole piece and responsive to the direction of fault power flow in the conductor for supplying a unidirectional current signal component to said additional pole piece in a direction corresponding to the direction of said fault power whereby said indicator flag indicates the direction of the fault.

14. A fault indicator as defined in claim 14 wherein said additional circuit means include magnetic coupling means for sensing the direction of fault power flow in the conductor.

15. A fault indicator as defined in claim 14 wherein said magnetic coupling means comprise an additional magnetic winding in magnetic communication with the conductor.

16. A fault indicator as defined in claim 15 wherein said circuit means further include voltage sensing means for sensing alternating voltage on the conductor, and switch means responsive to said sensed alternating voltage and the sensed direction of fault power flow in the conductor for developing a unidirectional control signal component from said alternating current for conditioning said status indicating means.

17. A fault indicator as defined in claim 16 wherein said voltage sensing means comprise a sensing electrode capacitively coupled to the conductor.

18. A fault indicator as defined in claim 17 wherein said switch means comprise a depletion type field effect transistor.

* * * * *